US008169269B2

(12) United States Patent
Bao

(10) Patent No.: US 8,169,269 B2
(45) Date of Patent: May 1, 2012

(54) HARTLEY VOLTAGE CONTROLLED OSCILLATOR

(75) Inventor: Mingquan Bao, Västra Frölunda (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 46 days.

(21) Appl. No.: 12/679,932

(22) PCT Filed: Sep. 25, 2007

(86) PCT No.: PCT/SE2007/050674
§ 371 (c)(1),
(2), (4) Date: Mar. 25, 2010

(87) PCT Pub. No.: WO2009/041868
PCT Pub. Date: Apr. 2, 2009

(65) Prior Publication Data
US 2010/0207695 A1 Aug. 19, 2010

(51) Int. Cl.
*H03K 3/354* (2006.01)
(52) U.S. Cl. .............. 331/117 FE; 331/117 R; 331/167; 331/181
(58) Field of Classification Search ............ 331/117 FE, 331/117 R, 167, 181
See application file for complete search history.

(56) References Cited

U.S. PATENT DOCUMENTS 3,231,834 A * 1/1966 Watanabe .................. 331/117 R
4,112,393 A * 9/1978 Waldorf et al. ............... 331/109
5,610,340 A * 3/1997 Carr et al. ....................... 73/718
6,982,605 B2 * 1/2006 Mondal et al. ............ 331/117 R
2005/0046499 A1 3/2005 Luong et al.
2007/0018741 A1 * 1/2007 Gabara ...................... 331/177 V

FOREIGN PATENT DOCUMENTS

DE 102006017189 A1 10/2007
EP 0 909 018 A1 4/1999
JP 2006-237833 A 9/2006

OTHER PUBLICATIONS

Zannoth, M. et al. A Single-CHIP SI-BIPOLAR 1.6GHz VCO with Integrated Bias Network. 1999 IEEE Radio Frequency Integrated Circuits Symposium: p. 117-120: Jun. 1999.
Jacobsson, H. et al. Low Phase Noise sub-1V Supply 12 an 18 GHz VCO in 90 nm CMOS. 2006 Microwave Digest, 573-576. Jun. 11-16, 2006.
Razavi, B. RF Microelectronics. Prentice Hall PTR, pp. 206-233. 1998.
Armstrong, E.H. Some Recently Developments in Audion Receiver. Proc IRE vol. 3, No. 9. pp. 215-247. Sep. 1915.
Chuang, Y.H. et al. 5-GHz Low Power Current-Reused Balanced CMOS Differential Armstrong VCOs. IEEE Microwave and Guided Waves Letters, vol. 17, No. 2, Feb. 2007.

* cited by examiner

*Primary Examiner* — Joseph Chang
*Assistant Examiner* — Jeffrey Shin

(57) ABSTRACT

In a Hartley voltage controlled oscillator (VCO) circuit comprising two inductors ($L_d$, $L_g$), a transistor (Q1) and a varactor (C), the two inductors ($L_d$, $L_g$) are arranged as a coupled inductor pair to enable positive mutual inductance (M) between them and reduce the size of the VCO.

9 Claims, 8 Drawing Sheets

HARTLEY VOLTAGE CONTROLLED OSCILLATOR

TECHNICAL FIELD

The present invention relates to voltage controlled oscillators in general, specifically to methods and arrangements enabling an improved balanced Hartley voltage controlled oscillator.

BACKGROUND

The development of wireless communication systems has increased the demand for monolithically integrated, low-cost and low-phase-noise voltage controlled oscillators (VCO:s). One known type of VCO is the so-called Hartley VCO. Such VCO:s are known to enable good phase noise performance at high frequencies, e.g. >15 GHz [1]. A Hartley VCO uses two inductors [2], which differs from other popular VCO topologies, e.g. Colpitts VCO and cross-coupled VCO. However, the so-called Armstrong VCO [3], [4] also uses two inductors.

In radio frequency (RF) or microwave monolithic (MM) integrated circuits (IC), an inductor is often much larger than a transistor, or other components. It thus consumes most of the chip area. With the scaling to ever-smaller dimensions of transistors, the manufacturing costs per square millimeter chip area increases significantly. Therefore, if chip size is at a premium, an instinctive choice is using as few inductors as possible. Consequently, the Hartley VCO by tradition has been deemed unsuitable for RFIC or MMIC applications, in terms of chip area costs caused by the use of two inductors.

There is therefore a need for a monolithically integrated Hartley VCO with reduced chip area requirements.

SUMMARY

An object of the present invention is to provide an improved Hartley VCO.

A further object of the present invention is to provide a compact balanced Hartley VCO.

Basically, a Hartley voltage controlled oscillator (VCO) circuit comprises two inductors ($L_d$, $L_g$), a transistor ($Q_1$) and a varactor (C), wherein the two inductors ($L_d$, $L_g$) are arranged as a coupled inductor pair to enable positive mutual inductance (M) between them. Thereby, the chip area of the Hartley VCO is reduced as compared to a conventional Hartley VCO.

Advantages of the present invention comprise:
an improved Hartley VCO with reduced size;
a Hartley VCO with enhanced feedback
a balanced Hartley VCO

BRIEF DESCRIPTION OF THE DRAWINGS

The invention, together with further objects and advantages thereof, may best be understood by referring to the following description taken together with the accompanying drawings, in which.

ABBREVIATIONS

CMOS Complementary Metal Oxide Semiconductor transistor
FET Field Effect Transistor
RF Radio Frequency
VCO Voltage Controlled Oscillator

DETAILED DESCRIPTION

Examples of the previously mentioned types of Voltage Controlled Oscillators are illustrated in FIGS. 1-4.

Figure 1:
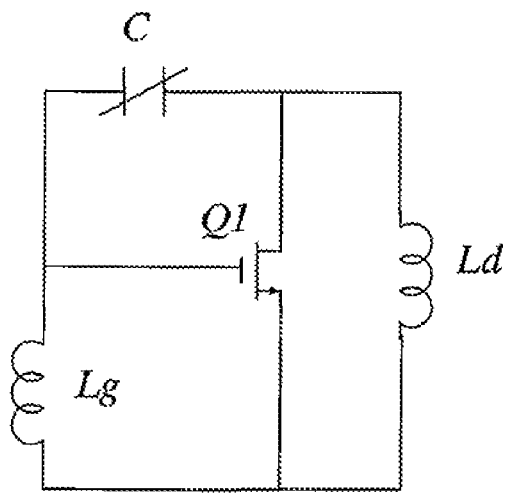
FIG. 1 is an illustration of a known Hartley VCO.
Figure 2:
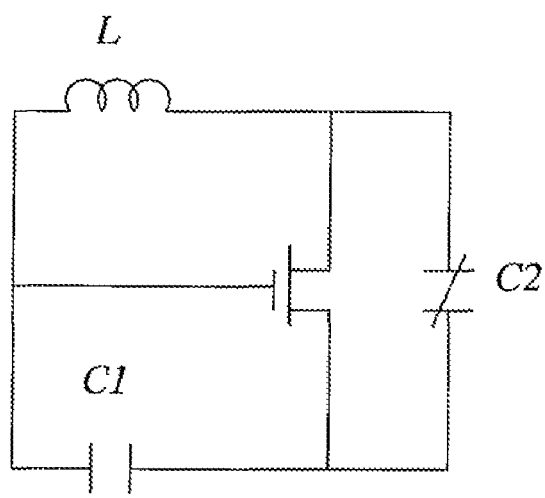
FIG. 2 is an illustration of a known Colpitts VCO.
Figure 3:
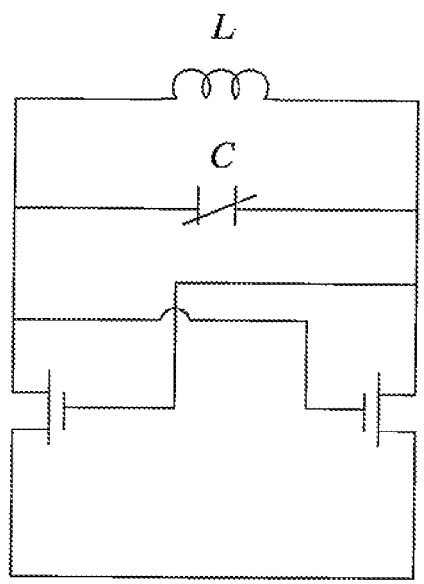
FIG. 3 is an illustration of a known cross-coupled VCO.
Figure 4:
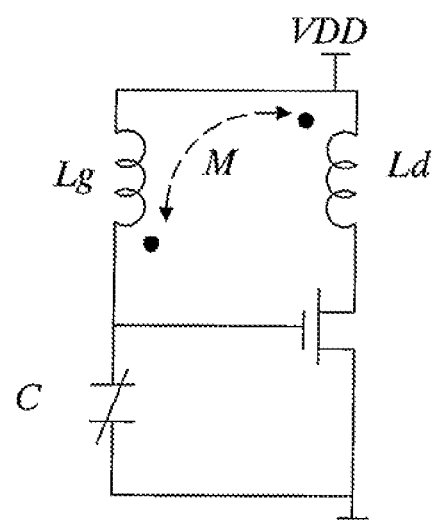
FIG. 4 is an illustration of a known Armstrong VCO.

With reference to FIG. 4, a known Armstrong VCO utilizes a coupled inductor pair, which provides a magnetic coupling feedback. This feedback can be described by a trans-impedance $Z_T(\omega)$. The feedback based on magnetic coupling sometimes may not be strong, so that a large transistor's trans-conductance, $g_T(\omega)$ is needed to maintain the oscillation. Since, the loop gain $H(\omega)=g_T(\omega) \cdot Z_T(\omega)$ must be equal to 1. While an increase of the transistor's trans-conductance gives rise to an increase of dc current or dc power consumption [2].

A description of coupling, mutual inductance and the dot convention is given in Appendix 1.

According to a basic embodiment of the present invention, a Hartley voltage controlled oscillator (VCO) circuit comprises two inductors $L_d$, $L_g$ arranged as a coupled inductor pair to enable positive mutual inductance M between them, a transistor $Q_1$ and a varactor C. The coupled inductor pair can be implemented as a stacked inductor pair, or arranged side by side.

Figure 5:
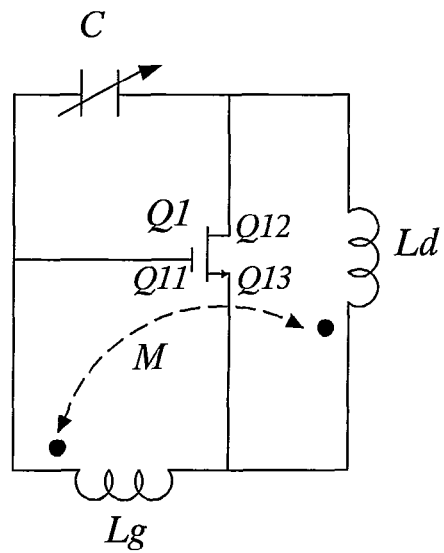
FIG. 5 is an illustration of an embodiment of a Hartley VCO according to the present invention.

According to a specific embodiment of the present invention, a Hartley VCO comprises coupled inductor pairs as shown in FIG. 5. The transistor in the VCO can be common-source configured or common-gate or common-drain configured, depending on which terminal of the transistor is grounded [2]. For example, in FIG. 6 a single-ended Hartley VCO with common-source configured CMOS is illustrated.

Figure 6:
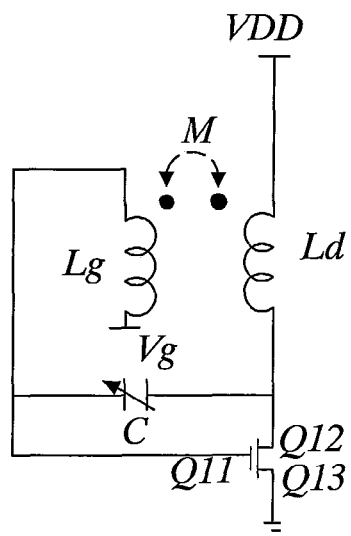
FIG. 6 is an illustration of another embodiment of a Hartley VCO according to the present invention.

The basic idea of this disclosure is to make use of the coupled inductor pair (see Armstrong VCO) to reduce physical size of the inductors in a Hartley VCO, as shown in FIG. 5 and FIG. 6. Two coupled inductors with mutual inductance totally have a smaller physical size than that of a single isolated inductor if one controls the current along two inductors flowing at the same direction. Because the total inductance $L_i(i=1,2)$ of the primary and secondary inductors is given by.

$L_i = L_{s,i} + M$ (currents flow at the same direction)

$L_i = L_{s,i} + M$ (currents flow at opposite directions)

where $L_{s,i}$ is the self inductance in the isolated case. M is the mutual inductance (see Appendix 1 for further description of the term). Thus, the positive mutual inductance reduces the requirement of the self-inductance for a given total inductance. The smaller self-inductance is the smaller is the physical size for the inductors.

Both the proposed Hartley VCO, as shown in FIG. 6, and the Armstrong VCO as shown in FIG. 4 utilizes the coupled inductor pair. However, one main difference is that the capacitor or varactor C across the gate and the drain of the transistor in the Hartley VCO is a part of a feedback loop. This capacitor C and these inductors $L_g$ and $L_d$ form a π-network which provides feedback $Z_T(\omega)$ [1]. In contrast, the capacitor C in the Armstrong VCO is ac-wise connected with $L_g$ in parallel. It has only the function of tuning frequency instead of affecting the feedback. In the presently proposed VCO topology, the magnetic coupling (mutual inductance, M) between the two inductors provides an additional feedback. Consequently, the demanding trans-conductance is reduced, and so is the dc current or dc power consumption.

According to a specific embodiment, with reference to FIG. 5, the Hartley VCO is arranged as a single-ended VCO. Thus, the Hartley VCO comprises a capacitor or varactor C arranged between first and second terminals Q11, Q12 of a first transistor Q1, a first inductor $L_d$ is arranged between second and third terminals Q12, Q13 of the first transistor Q1, a second inductor $L_g$ is arranged between said third and said first terminal Q13, Q11. The first and second inductors are arranged as a coupled inductor pair with mutual inductance M.

According to another specific embodiment, with reference to FIG. 6, the Hartley VCO is arranged as a common-source configured CMOS. Consequently, a capacitor or varactor C is arranged between first and second terminals Q11, Q12 of a transistor Q1, a first inductor $L_d$ is arranged between a voltage source $V_{DD}$ and said second terminal Q12, a second inductor $L_g$ is arranged between said first terminal Q11 and a bias voltage source $V_g$. The first and second inductors are arranged as a coupled inductor pair with mutual inductance M.

In the above illustrated embodiments the transistors are drawn as a CMOS, but are equally adaptable to FET.

The so-called balanced Hartley VCO [1] has several advantages over single-ended ones. For instance, 1) a balanced Hartley VCO can provide differential output signals; 2) the virtual ground in a balanced VCO can be used to connect dc supplier, which immures dc supplier noise. Thus, in practice, a balanced Hartley VCO is even more useful then the previously described single-ended one.

Figure 7:
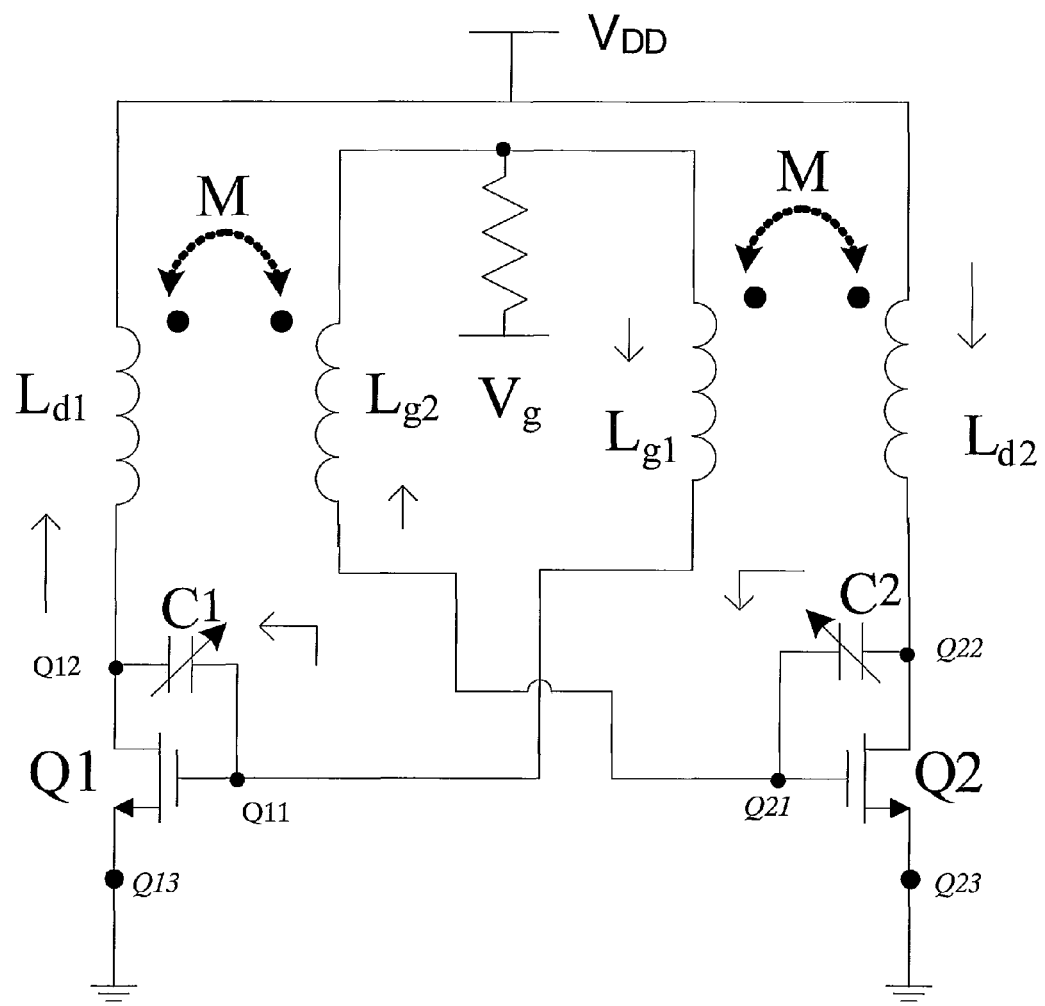
FIG. 7 is an illustration of a further embodiment a Hartley VCO according to the present invention.

According to a further embodiment, with reference to FIG. 7, a balanced VCO with two coupled inductor pairs is presented. As mentioned before, the direction of the currents in the coupled inductors is crucial to reduce the chip size. Thus, some special connections have to be made in order to control the ac currents flowing in the arrow direction, as shown in FIG. 7.

The embodiment in FIG. 7 of a balanced VCO comprise four inductors $L_{d1}$, $L_{g1}$, $L_{d2}$, $L_{g2}$ arranged into two coupled inductor pairs $L_{d1}$, $L_{g2}$; $L_{d2}$, $L_{g1}$, two capacitors varactors C1, C2, and two transistors Q1, Q2, where one varactor C1 is arranged between first and second terminals Q11, Q12 of one transistor Q1, a third terminal Q13 of the transistor Q1 is grounded. A first inductor $L_{d1}$ is arranged between the first terminal Q11 and a first bias voltage source $V_{DD}$. A second inductor $L_{g1}$ is arranged between first terminal Q11 and a second bias voltage source $V_g$. A second capacitor or varactor C2 is arranged between a first and a second terminal Q21, Q22 of a second transistor Q2, of which a third terminal Q23 is grounded. A third inductor $L_{d2}$ is arranged between said first terminal Q21 of the second transistor Q2 and said first bias voltage source $V_{DD}$. A fourth inductor $L_{g2}$ is arranged between the first terminal Q21 of the second transistor Q2 and said second bias voltage source $V_g$. The first inductor $L_{d1}$ and fourth inductor $L_{g2}$ are arranged as a first coupled inductor pair, and the second inductor $L_{g2}$ and the third inductor $L_{d2}$ are arranged as a second coupled inductor pair to provide positive mutual inductance M. The capacitors or varactors C1, C2 enable tuning of the oscillator frequency.

According to the above described embodiment the first terminals of the transistors comprise gate terminals, the second terminals comprise the drain terminals, and the third terminals comprise source terminals. Also, the first bias voltage source is a drain bias voltage source. The second bias voltage source is a gate bias voltage source. Depending on the type of transistor used, the notation would be different without leaving the scope of the present invention.

Figure 8:
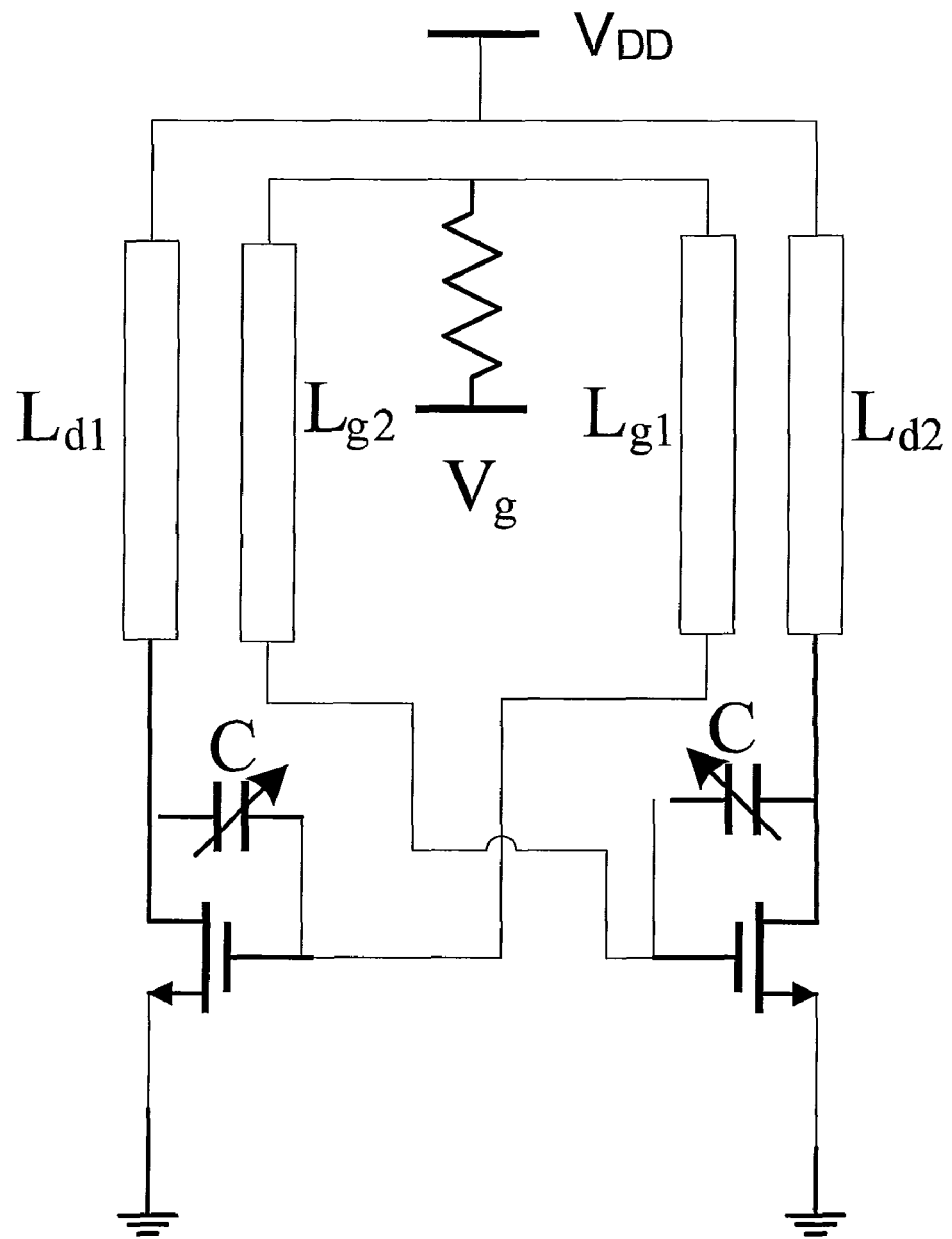
FIG. 8 is an illustration of another embodiment of a a Hartley VCO according to the present invention.

Such a connection can force the current flowing along the coupled inductor at the same direction. Thus, the positive mutual inductance M is available. In practice, high-Q coupled transmission lines are used as coupled inductors, as shown in FIG. 8.

If the coupled inductors are connected in another way, the ac currents in the coupled inductors can flow at the opposite direction. For example, one uses $L_{d1}$ and $L_{g1}$ (or $L_{d2}$ and $L_{g2}$) as a coupled inductors pair, and connects the gate and the source of Q1 to $L_{g1}$ and $L_{d1}$ respectively; so do the gate and the source of Q2 to $L_{g2}$ and $L_{d2}$ respectively. It turns out a negative mutual inductance is obtained, thus the purpose of reducing the chip size cannot be realized.

Figure 9:
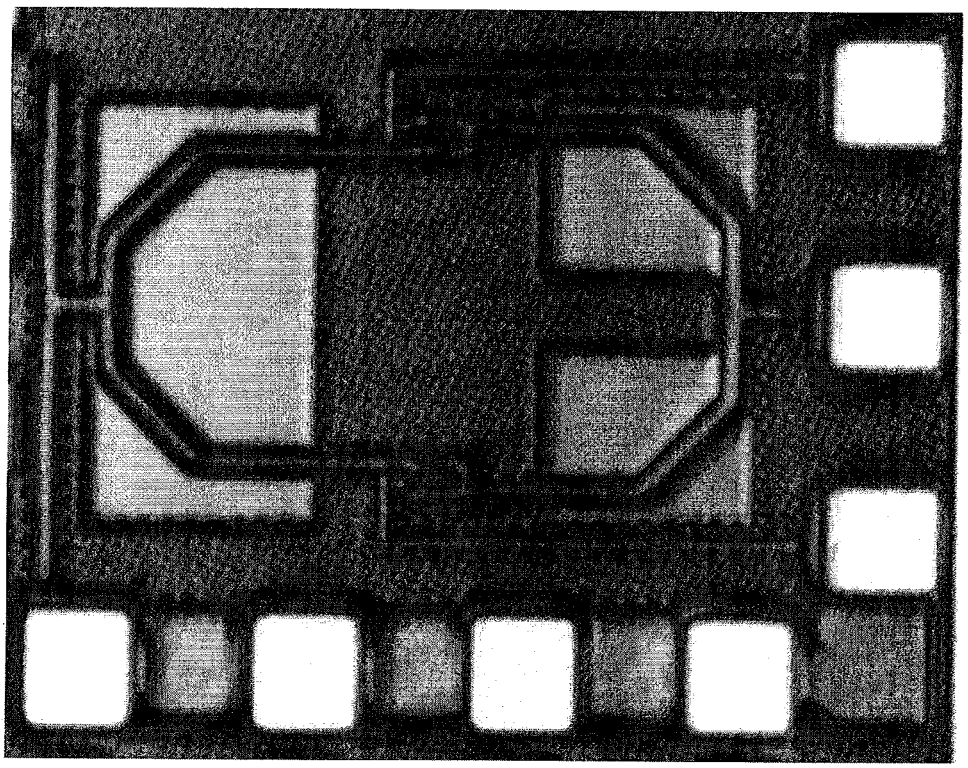
FIG. 9A is a photo of a Hartley VCO according to the invention.
FIG. 9B is a photo of a prior art Hartley VCO.
Figure 9:
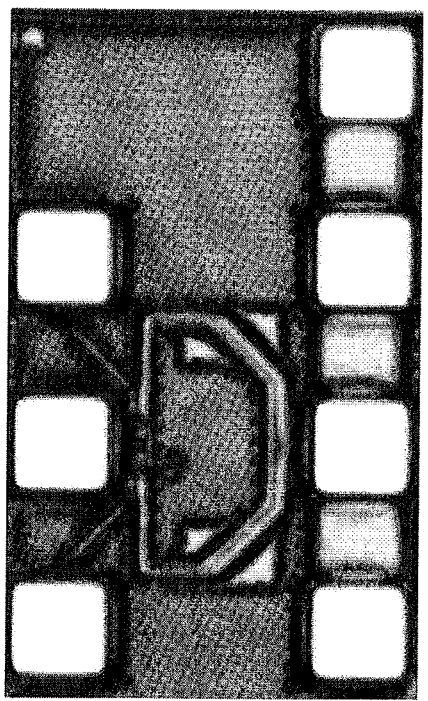
Figure 10:
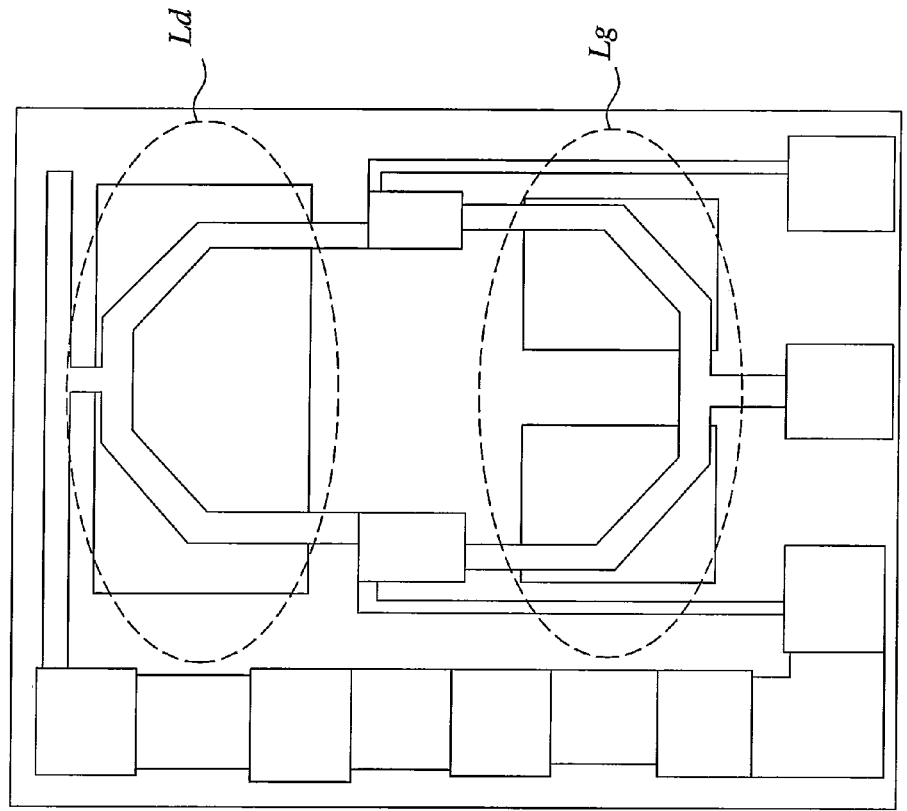
FIG. 10A is a schematic illustration of the photo in FIG. 9A.
FIG. 10B is a schematic illustration of the photo in FIG. 9B.
Figure 10:
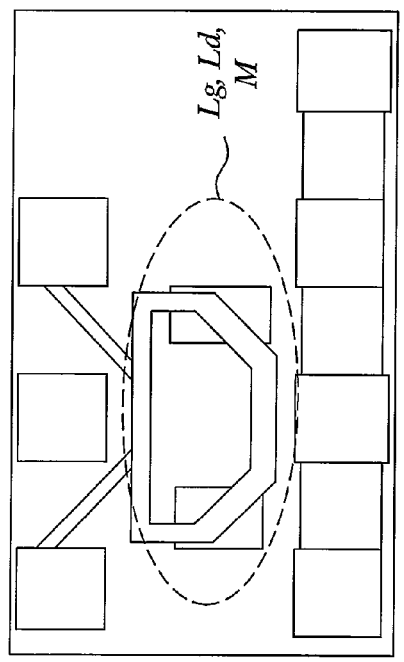

For the coupled inductor pair used in the Hartley VCO according to the present invention, the positive mutual inductance enables the physical size of the VCO to be reduced significantly. For example, photographs of two Hartley VCOs operating at the same frequency (22 GHz) are shown in FIGS. 9A and 9B. They have the same topology except one using coupled inductors, a shown in FIG. 9A and the other using isolated inductors, as shown in FIG. 9B. The former has only ⅓ size of the latter, excluding the pads. For illustration purposes the Hartley VCO of FIGS. 9A and 9B are shown schematically in FIG. 10A and FIG. 10B.

Figure 11:
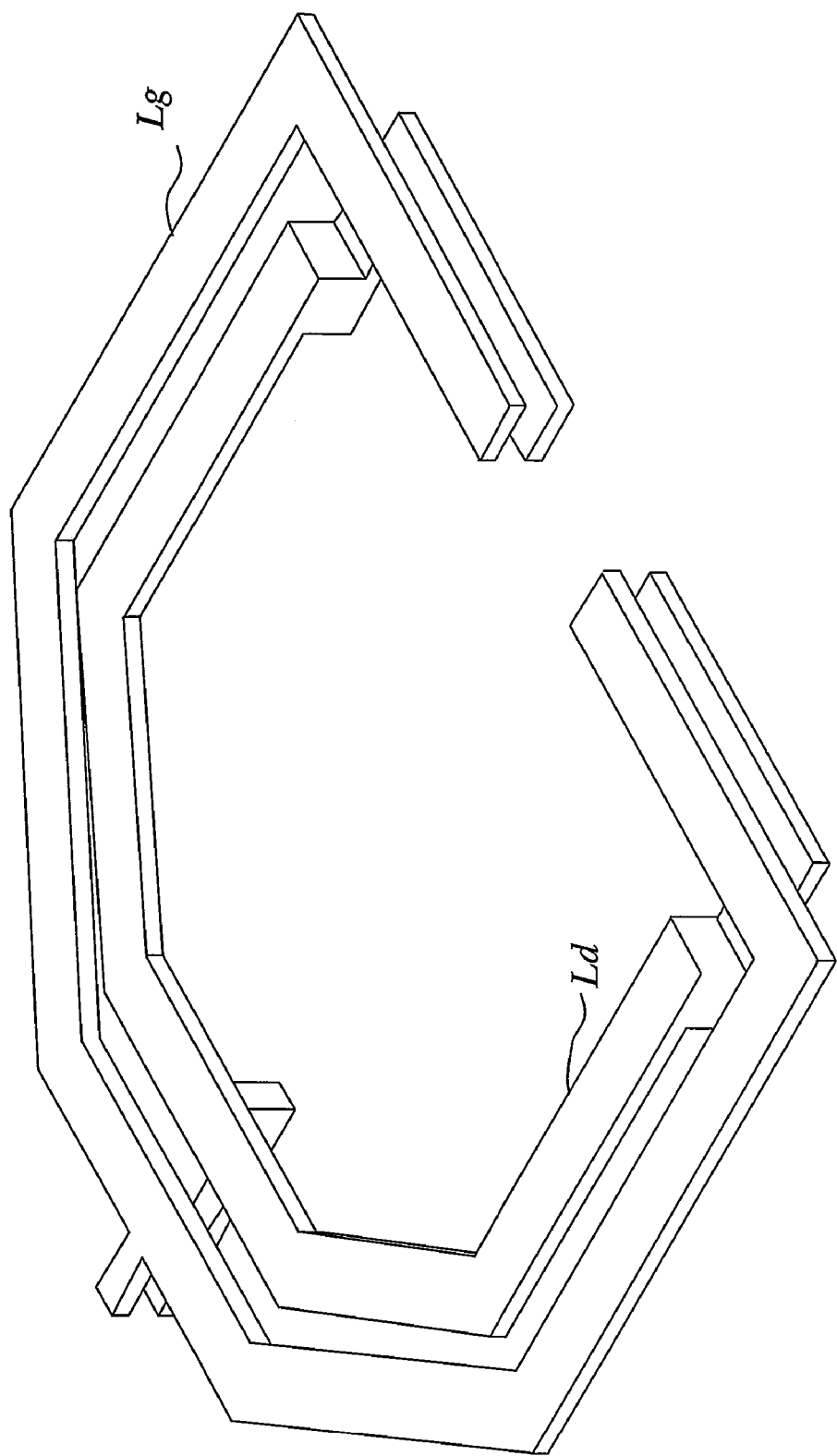
FIG. 11 is an enlarged illustration of an embodiment of the inductors of FIG. 10A.

As stated previously, the coupled inductor pair(s) can be implemented as stacked or side-by-side inductors. For illustrative reasons FIG. 11 discloses the inductors (Lg, Ld) of FIG. 10A. The figures are only schematic representations showing the details most relevant for the disclosure of the present invention. The skilled person realizes that various components or features may be added without differing from the general idea of the present invention.

Advantages of the present invention comprise:
  an improved Hartley VCO with reduced size;
  positive mutual inductance enhances the feedback. This results in reducing the demanding for trans-conductance of the transistor, consequently reducing the dc current or dc power consumption;
  the proposed VCO keeps the advantages of the balanced topology, i.e. having differential output, immuring the common-mode noise etc.

The VCO utilizing coupled inductors according to the present invention can be implemented in any semiconductor technology, e.g. CMOS in Silicon, bipolar in Silicon or GaAs, FET in GaAs etc.

It will be understood by those skilled in the art that various modifications and changes may be made to the present invention without departure from the scope thereof, which is defined by the appended claims.

REFERENCES

[1] H. Jacobsson et al, "Low phase noise sub-1V supply 12 an 18 GHz VCO in 90 nm CMOS", 2006 Microwave Symposium Digest, 573-576.

[2] B. Razavi, "RF microelectronics", Prentice Hall PTR, pp 206-233, 1998.
[3] E. H. Armstrong, "Some recently developments in the audion receiver", Proc. IRE vol. 3, no 9, pp 215-247, September 1915.
[4] Y. H. Chuang, S. L. Jang, S. H. Lee, R. H. Yen, J. J. Jhao, "5-GHz low power current-reused balanced CMOS differential Armstrong VCOs", IEEE Microwave and Guided Waves Letters, Vol 17, No. 2, pp 129-141, February 2007.

APPENDIX 1

Mutual Inductance

Mutual inductance M is the concept that the current through one inductor can induce a voltage in another nearby inductor. It is important as the mechanism by which transformers work, but it can also cause coupling between conductors in a circuit.

The mutual inductance M is also a measure of the coupling between two inductors. The mutual inductance by circuit i on circuit j is given by the double integral Neumann formula $$M_{ij} = \frac{\mu_0}{4\pi} \oint_{C_i} \oint_{C_j} \frac{ds_i ds_j}{|R_{ij}|}$$

Dot Convention

In circuit analysis, the dot convention is used to denote the voltage polarity of the mutual inductance of two components. (Reference is made to FIGS. 4-7 of this disclosure) Two good ways to think about this convention:

1. The current goes into one dot (either dot) "tries" to come out of the other dot. "Into" meaning from the dot toward the inductor, and conversely "out" meaning from the inductor toward the dot.

2. Current going into a dotted terminal of the inductor induces a positive voltage at the other dot. Conversely, current leaving a dotted terminal induces a negative voltage at the other dot.

What is claimed is:

1. A Hartley voltage controlled oscillator (VCO) circuit comprising two inductors ($L_d$, $L_g$), a transistor ($Q_1$) and a varactor (C) wherein the two inductors ($L_d$, $L_g$) are arranged as a coupled inductor pair operable to enable positive mutual inductance (M) between them, wherein the arrangement comprising four inductors ($L_{d1}$, $L_{g1}$, $L_{d2}$, $L_{g2}$) arranged into two coupled inductor pairs, two varactors (C1, C2), and two transistors (Q1, Q2), wherein:

the first varactor (C1) is arranged between first and second terminals (Q11, Q12) of the first transistor (Q1);
a third terminal (Q13) of the first transistor (Q1) is grounded;
a first inductor ($L_{g1}$) is arranged between the first terminal (Q11) and a first bias voltage source ($V_{DD}$)
a second inductor ($L_{g1}$) is arranged between the first terminal (Q11) and a second voltages source ($V_g$);
the second varactor (C2) is arranged between a first and a second terminal (Q21, Q22) of the second transistor (Q2);
a third terminal (Q23) of the second transistor (Q2) is grounded;
a third inductor ($L_{d2}$) arranged between the first terminal (Q21) and the first bias voltage source ($V_{DD}$);
a fourth inductor ($L_{g2}$) is arranged between the first terminal (Q21) of the second transistor (Q2) and the second bias voltage source ($V_g$); and
wherein the first inductor ($L_{d1}$) and the fourth inductor ($L_{g2}$) are arranged as a first coupled inductor pair, and the second inductor ($L_{g2}$) and the third inductor ($L_{d2}$) are arranged as a second coupled inductor pair to provide positive mutual inductance (M).

2. The Hartley VCO according to claim 1, wherein the two inductors ($L_{d1}$, $L_{g2}$) are arranged as a stacked inductor pair.

3. The Hartley VCO according to claim 1, wherein the two inductors ($L_{d1}$, $L_{g2}$) are arranged as a side by side coupled inductor pair.

4. The voltage controlled oscillator according to claim 1, wherein the voltage controlled oscillator is manufactured utilizing complementary metal oxide semiconductors (CMOS).

5. The voltage controlled oscillator according to claim 4, wherein the voltage controlled oscillator is manufactured utilizing CMOS in silicon.

6. The voltage controlled oscillator according to claim 1, wherein the voltage controlled oscillator is manufactured utilizing bipolar transistors.

7. The voltage controlled oscillator according to claim 6, wherein the voltage controlled oscillator is manufactured utilizing bipolar transistors in silicon.

8. The voltage controlled oscillator according to claim 6, wherein the voltage controlled oscillator is manufactured utilizing bipolar transistors in gallium arsenide (GaAS).

9. The voltage controlled oscillator according to claim 6, wherein the voltage controlled oscillator is manufactured utilizing field effect transistors (FETs) in gallium arsenide (GaAS).

* * * * *

UNITED STATES PATENT AND TRADEMARK OFFICE
CERTIFICATE OF CORRECTION

| | |
|---|---|
| PATENT NO. | : 8,169,269 B2 |
| APPLICATION NO. | : 12/679932 |
| DATED | : May 1, 2012 |
| INVENTOR(S) | : Bao |

It is certified that error appears in the above-identified patent and that said Letters Patent is hereby corrected as shown below:

In Column 1, Line 53, delete "VCO" and insert -- VCO. --, therefor.

In Column 2, Line 3, delete "a a" and insert -- a --, therefor.

In Column 2, Line 13, delete "10A;" and insert -- 10A. --, therefor.

In Column 2, Line 65, delete "$L_{s,I}$," and insert -- $L_{s,i}$ --, therefor.

In Column 6, Line 5, in Claim 1, delete "$(L_{g1})$" and insert -- $(L_{d1})$ --, therefor.

In Column 6, Line 6, in Claim 1, delete "$(V_{DD})$" and insert -- $(V_{DD})$; --, therefor.

In Column 6, Line 8, in Claim 1, delete "second voltages" and
insert -- second bias voltage --, therefor.

In Column 6, Line 14, in Claim 1, delete "arranged" and insert -- is arranged --, therefor.

Signed and Sealed this
Eighteenth Day of September, 2012

David J. Kappos
*Director of the United States Patent and Trademark Office*